United States Patent [19]

Michael et al.

[11] Patent Number: 5,926,717

[45] Date of Patent: *Jul. 20, 1999

[54] METHOD OF MAKING AN INTEGRATED CIRCUIT WITH OXIDIZABLE TRENCH LINER

[75] Inventors: Mark W. Michael, Cedar Park; Robert Dawson, Austin; Basab Bandyopadhyay, Austin; H. Jim Fulford, Jr., Austin; Fred N. Hause, Austin; William S. Brennan, Austin, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/763,313

[22] Filed: Dec. 10, 1996

Related U.S. Application Data

[51] Int. Cl.⁶ .............................. H01L 21/76; H01L 21/62
[52] U.S. Cl. ...................... 438/387; 438/431; 438/432; 438/692
[58] Field of Search ...................... 438/431, 432, 438/FOR 227, FOR 232, 210, 221, 244, 387, 692, FOR 212, FOR 220

[56] References Cited

U.S. PATENT DOCUMENTS

| 4,356,211 | 10/1982 | Riseman . |
|---|---|---|
| 4,471,525 | 9/1984 | Sasaki . |
| 4,493,740 | 1/1985 | Komeda . |
| 4,621,414 | 11/1986 | Iranmanesh . |
| 4,666,556 | 5/1987 | Fulton et al. . |
| 4,921,816 | 5/1990 | Ino . |
| 4,978,634 | 12/1990 | Shen et al. . |
| 5,075,248 | 12/1991 | Yoon et al. . |
| 5,234,856 | 8/1993 | Gonzalez . |
| 5,246,537 | 9/1993 | Cooper et al. . |
| 5,248,625 | 9/1993 | Pasch . |
| 5,250,458 | 10/1993 | Tsukamoto et al. . |
| 5,258,321 | 11/1993 | Shimizu et al. . |
| 5,346,845 | 9/1994 | Jun . |
| 5,472,904 | 12/1995 | Figura et al. . |
| 5,504,027 | 4/1996 | Jeong et al. . |
| 5,521,111 | 5/1996 | Sato . |
| 5,571,743 | 11/1996 | Henkels et al. . |

*Primary Examiner*—George R. Fourson
*Attorney, Agent, or Firm*—Conley, Rose & Tayon; Robert C. Kowert; Kevin L. Daffer

[57] ABSTRACT

A method for isolating a first active region from a second active region, both of which are configured within a semiconductor substrate. The method comprises forming a trench in the semiconductor substrate between said first active region and said second active region. A first dielectric layer is then formed on said trench and a polysilicon layer is deposited on said first dielectric layer. The polysilicon layer is then thermally oxidized to form a second dielectric layer. Preferably the first dielectric is a thermal oxide 40 to 500 angstroms in thickness consuming less than 200 angstroms of said first active region and said second active region. The polysilicon layer is preferably between 1000 to 2000 angstroms.

25 Claims, 7 Drawing Sheets

METHOD OF MAKING AN INTEGRATED CIRCUIT WITH OXIDIZABLE TRENCH LINER

BACKGROUND OF THE INVENTION

1. Field of the Invention

This invention relates to semiconductor fabrication and more particularly to an improved process of forming a shallow trench isolation structure with enhanced field dielectric characteristics and preservation of active area sidewall. The shallow trench isolation structure may further comprise an improved capacitor structure. The field dielectric and capacitor structure are formed by conversion of a deposited polycrystalline layer deposited within a trench formed by a shallow trench processing sequence.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS processing involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beak structure can unacceptably encroach into the device active area. Second, the pre-implanted channel-stop dopant redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topographical disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for submicron MOS technologies. The shallow trench process is better suited for isolating densely spaced active devices having field regions less than one micron in lateral dimension.

Conventional trench processes involve the steps of etching a silicon substrate surface to a relatively shallow depth, e.g., between 0.2 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

While the conventional trench isolation process has many advantages over LOCOS, it is generally recognized that deposited oxide used to fill the trench is of a lower dielectric quality than thermally grown field oxide used in LOCOS processing. Deposited dielectrics, such as CVD $SiO_2$, are generally less dense than thermally grown oxides and have an altered stoichiometry that can cause changes in the mechanical and electrical properties of the film. Thermally grown oxide, on the other hand, has a generally uniform stoichiometry arranged for consistent electrical isolation micro and macroscopically across the dielectric structure. If oxide is thermally grown on the isolation trenches however, silicon at the periphery of the trench is consumed and the isolation structure encroaches on the active area (similar to the manner in which the bird's beak encroaches the active area in a conventional LOCOS process). It would be desirable to combine the advantages obtained by using a thermal oxide as an isolation structure with the advantages afforded by trench processing.

In addition, LOCOS and conventional trench isolation processes also present problems associated with the fabrication of discrete capacitors. Many semiconductor devices, such as those used in telecommunication products, require capacitors to handle various analog signals. For example, switching of carefully sized capacitors is necessary to accurately sample an analog signal. Modulators which use switch capacitor structures, i.e., delta sigma modulators rely upon carefully controlled capacitor structure to accurately sample an incoming analog signal. Modems, codecs, analog filters, and quantizers also rely upon the integrity of the capacitor structure. Processes designed primarily for fabricating transistors and interconnects for high speed digital applications are less than ideally suited for manufacturing passive circuit elements. It is not uncommon in such processes, for example, to produce capacitors by arranging a dielectric between first and second metal levels or between a metal level and a substrate. Controlling the capacitance of these structures is difficult due to variations in the inter-level dielectrics caused by multi-layered dielectric structures and multiple planarization steps.

In addition, the thickness of the dielectric between the "plates" of metal-to-metal and metal-to-substrate capacitors requires large area structures to obtain an adequate capacitor in many applications. Dielectric thickness must by quite small in many precision capacitor applications, yet there is a tendency to increase the interlevel dielectric thickness to reduce unwanted capacitive coupling between, for example, interconnect lines carrying digital signals. Thus, it is often difficult to merge the benefits of digital circuitry with analog circuits often attributed to telecommunication applications.

Capacitance C of a parallel plate structure is given by:

$$C = \kappa \epsilon_0 A / d \qquad \text{(Eq. 1)}$$

where $\kappa$ is the dielectric constant (approximately 3.9 for $SiO_2$), $\epsilon_0$ is the permittivity constant ($8.9 \times 10^{-12}$ $C^2/N\text{-}m^2$), d is the distance between the plates, and A is the cross-sectional area of the structure, it is seen that:

$$A = dC / \kappa \epsilon_0 \qquad \text{(Eq. 2)}$$

Thus, a 1.0 picofarad capacitor using a metal-to-metal structure with an 0.8 micron $SiO_2$ interlevel dielectric would require a cross sectional area of approximately 23,000 square microns. The capacitor area can represent a significant percentage of the device's entire area. While reducing the interlevel dielectric thickness would reduce the area required to produce a given discrete capacitor, it would also increase unwanted capacitive coupling between interconnects on the first level and interconnects on the second level. As device geometries have continued to shrink, capacitive coupling effects have become more significant in determining the speed at which the device may be operated. Consequently, an industry trend is to increase the thickness of interlevel dielectrics to combat undesirable parasitic capacitance—opposite that which may be needed for producing a small analog sampling capacitor. From equation 2, increased dielectric thickness requires an even larger area capacitor.

It would therefore be desirable to implement a method to produce discrete capacitors requiring less cross-sectional area than discrete capacitors produced from conventional LOCOS and trench processes. It would also be desirable to implement a method to produce discrete capacitors having a capacitance that is independent of the metal-to-substrate dielectric and the metal-to-metal dielectric thickness.

SUMMARY OF THE INVENTION

The problems noted above are in large part addressed by a method of and structure for isolating active areas within a semiconductor wafer substrate. A trench is formed in a semiconductor substrate between active areas of adjacent devices (transistors). A thin thermal oxide is grown on the trench surface and a layer of polycrystalline silicon (polysilicon) is then deposited on the thermal oxide. The polysilicon layer is then readily oxidized relative to the thermal oxide. Oxidization of the polysilicon layer takes place in a thermal oxidation step, whereby the trench is consumed with grown oxide. The surface of the wafer is then planarized to produce a trench isolation structure filled with thermal oxide. Upon planarization, the upper surface of the thermal oxide is of substantially the same elevational level as the adjacent silicon mesa (i.e., active area) upper surfaces. The deposited polysilicon layer allows for a thermal oxidation cycle that does not substantially consume the pre-existing thermal oxide at the silicon mesa sidewall. Thus, the grown thermal oxidation cycle minimizes encroachment into the adjacent active areas. Instead, the thermal oxidation consumes the polysilicon deposited into the trench.

Depositing a polysilicon layer on a trench also facilitates the formation of discrete capacitors. The polysilicon layer deposited on the relatively shallow (0.2 microns to 0.5 microns) isolation trench is used as a first plate of a capacitor structure. The polysilicon layer is doped and, in lieu of the oxidation performed on the trench isolation structures, a dielectric is deposited on the polysilicon layer to fill the trench. The upper surface of the structure is then planarized. The second plate can be comprised of the polysilicon layer typically used to form the gate structure in metal-oxide-semiconductor (MOS) processes. Because the effective distance between the capacitor plates in such a structure consists solely of the trench dielectric (and possibly the gate oxide which is negligibly thin compared to the trench dielectric) the area required to produce the capacitor can be significantly reduced. In addition, the capacitance of such a structure would be independent of the thickness of the metal-to-substrate dielectric and any metal-to-metal dielectrics.

The two methods can be advantageously combined to produce trench isolation structures and discrete capacitors on a single wafer. In one embodiment, a masking step is performed following the polysilicon deposition so that the polysilicon layer within the capacitor structure (the capacitor polysilicon plate) may be selectively implanted with phosphorous. Next, a layer of silicon nitride is formed and patterned so that the polysilicon layer within the trench isolation structure (the isolation polysilicon) may be selectively oxidized. It is therefore recognized that the isolation polysilicon is exclusive of capacitor areas and associated polysilicon plate regions. The wafer is thereafter planarized with an etch-back process or a chemical mechanical polish in both the isolation and capacitor areas. In addition to preventing oxidation of the capacitor polysilicon, the silicon nitride film may be left in place to serve as the capacitor dielectric. Because silicon nitride films have a dielectric constant that is approximately twice that of $SiO_2$ films, the capacitor cross sectional area can be approximately one-half the size of capacitors utilizing $SiO_2$ dielectrics. A smaller capacitor proves advantageous in integrated circuits embodying substantial analog devices.

Broadly speaking, the present invention comprises a method for isolating a first active region of a semiconductor wafer substrate from a second active region. A trench is formed, preferably by an anisotropic dry etch, between the first and second active regions in the wafer substrate. A dielectric layer, preferably a thermally grown $SiO_2$ layer of 500 angstroms or less, is then formed on the semiconductor surface. Polysilicon is then deposited, suitably conformally deposited, on the dielectric layer. Thereafter, the polysilicon layer is thermally oxidized and converted to relatively stoichiometric $SiO_2$. Because the thermal oxidation consumes the polysilicon layer rather than the silicon substrate layer, the transition regions between the active areas and the trench isolation structure is short, preferably less than 200 angstroms.

The present invention further contemplates a method for fabricating a discrete capacitor within a semiconductor substrate. Similar to the method for isolating active regions, a trench is formed in a substrate, a dielectric is formed on the wafer surface, and a layer of polysilicon is deposited on the dielectric. The polysilicon layer is doped either in situ during deposition, or subsequent to deposition with an ion implant or a diffusion step. In one embodiment, the polysilicon can be patterned with a masking step and an etch step. A dielectric layer is then deposited on the polysilicon layer to fill the trench structure. The wafer is then planarized and a third dielectric is formed, preferably during the gate oxidation cycle of the process. A second polysilicon layer is deposited on the third dielectric structure, preferably comprised of the silicon gate structure.

The present invention still further contemplates a method for forming trench isolation structures and trench capacitors in the same wafer. A capacitor trench and an isolation trench are formed in a semiconductor substrate. A first dielectric, preferably a thermal $SiO_2$ layer of approximately 500 angstroms or less is formed on the wafer surface. A polysilicon layer is then deposited on the first dielectric layer. The isolation polysilicon is then masked with photoresist so that a separate and distinct capacitor polysilicon can be selectively implanted with phosphorous. After the photoresist is stripped, a silicon nitride film is deposited on the polysilicon and selectively removed over the isolation polysilicon. The isolation polysilicon is then thermally oxidized to fill the isolation trench. In one embodiment, a CVD oxide may be deposited on the wafer to fill any unfilled portion of the capacitor trench. The wafer surface is then planarized back to the silicon substrate surface.

The present invention yet further contemplates a structure for isolating a first active region from a second active region. The structure comprises a trench shaped dielectric between a first active region and a second active region. The dielectric is preferably comprised of thermal $SiO_2$. A transition region between the active region and the isolation structure is less than 200 wide at the surface of said substrate.

The present invention even still further contemplates a capacitor structure. The capacitor structure comprises a U-shaped dielectric layer formed upon a trench located in a semiconductor substrate. A U-shaped layer of doped polysilicon is conformally situated upon the U-shaped dielectric layer. A dielectric fills the interior of the U-shaped dielectric. In one embodiment, the filler dielectric comprises silicon nitride. The upper surface of the filler dielectric, the U-shaped polysilicon, and the substrate surface are substantially coplanar. A third dielectric layer and a second doped polysilicon layer are located on the substantially planar upper surface of the filler dielectric, the U-shaped polysilicon, and the substrate.

BRIEF DESCRIPTION OF THE DRAWINGS

Other objects and advantages of the invention will become apparent upon reading the following detailed description and upon reference to the accompanying drawings in which.

DETAILED DESCRIPTION OF THE DRAWINGS

Figure 1:
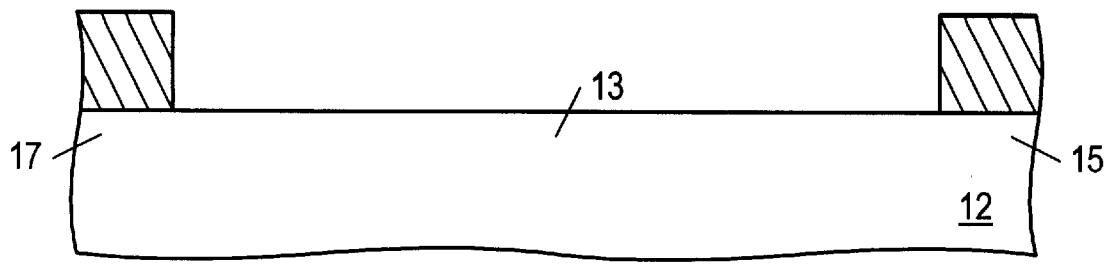
FIG. 1 is a partial cross-sectional view of a semiconductor substrate with an etch mask formed thereon.

Turning now to the drawings, FIG. 1 shows a semiconductor substrate 12 having first active region 15 and second active region 17. Etch mask 14 has been formed on substrate 12 and patterned to expose region 13 of substrate 12 between first active area 15 and second active area 17. First active area 15 and second active area 17 are areas of substrate 12 into which transistors may subsequently be formed. In one embodiment, etch mask layer 14 is comprised of photoresist, and/or of $SiO_2$, deposited on substrate 12 in a spin on technique or through chemical vapor deposition.

Figure 2:
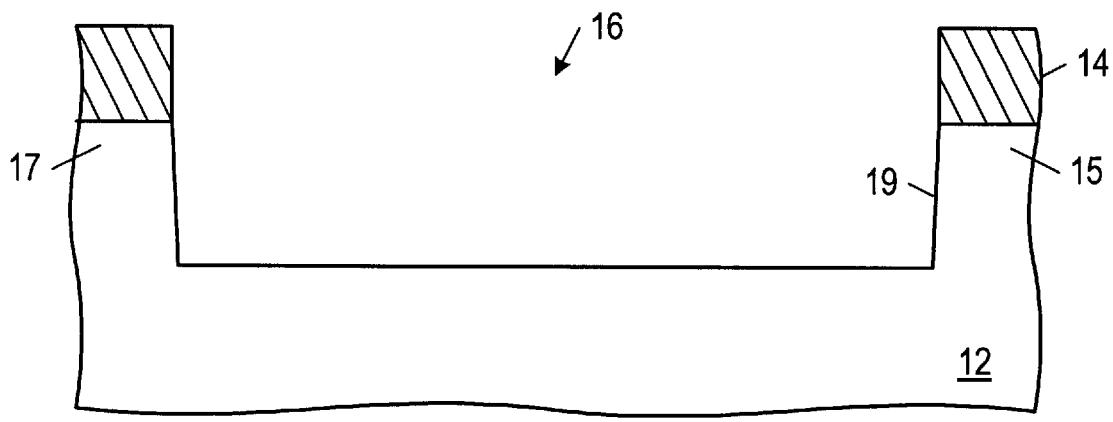
FIG. 2 is a process step subsequent to that shown in FIG. 1, in which a trench has been etched into the semiconductor substrate.

FIG. 2 shows the substrate of FIG. 1 after trench 16 has been formed between first active region 15 and second active region 17. Formation of trench 16 is preferably accomplished with a plasma etch. The plasma etch is preferably carried out using a fluorocarbon/$H_2$ mixture in which the percentage of hydrogen is less than 10%. At low concentrations of hydrogen, the etch rate of silicon is approximately twice the etch rate of silicon dioxide. With proper control, plasma etching can result in an anisotropic etch that creates substantially vertical sidewall 19 of trench 16.

Figure 3:
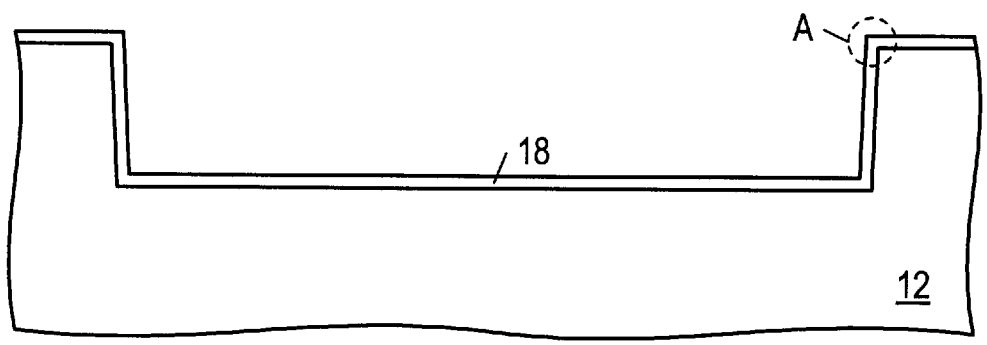
FIG. 3 is a processing step subsequent to that shown in FIG. 2, in which a thermal oxide layer has been grown on the surface of the semiconductor substrate.
Figure 12:
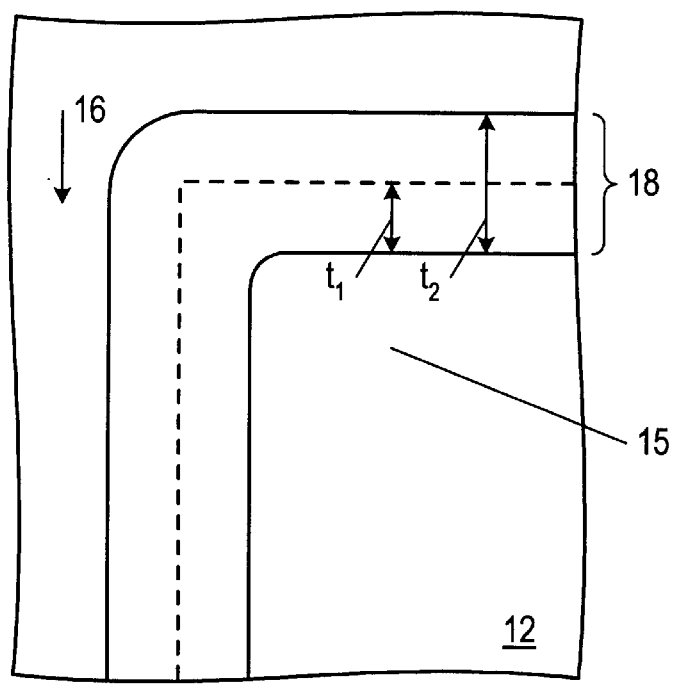
FIG. 12 is a detailed view along area A of FIG. 3, depicting encroachment of thermal oxide upon the substrate active area sidewall and corner as a result of the processing step of FIG. 3.

FIG. 3 shows first dielectric layer 18 formed on trench 16. Dielectric 18 is preferably a thermal oxide. In one embodiment, dielectric 18 is approximately 40 angstroms to 500 angstroms thick. Turning to FIG. 12, a detail of area A of FIG. 3 is shown. In this detailed view of area A, it can be seen that, when thermally grown, dielectric 18 consumes a portion of active area 15. As is well known in the art, thermal oxides extend partially into the original silicon surface. The horizontal dashed line in the drawing represents the location of the silicon surface prior to the oxidation. The distance represented by $t_2$ is the thickness of dielectric 18. The distance $t_1$ represents the thickness of the silicon surface consumed by the thermal oxidation. Generally, $t_1 \cong 0.45 * t_2$. Consumption of the silicon surface by thermal oxidation is inevitable, but is nevertheless undesirable in this process because portions of first active region 15 (and second active region 17) are consumed during the thermal oxidation. Prior to the thermal oxidation, active area 15 extended to the edge of the silicon surface represented by the vertical dashed line in FIG. 12. After formation of the thermal oxide, dielectric 18 consumes a portion of active area 15.

Figure 4:
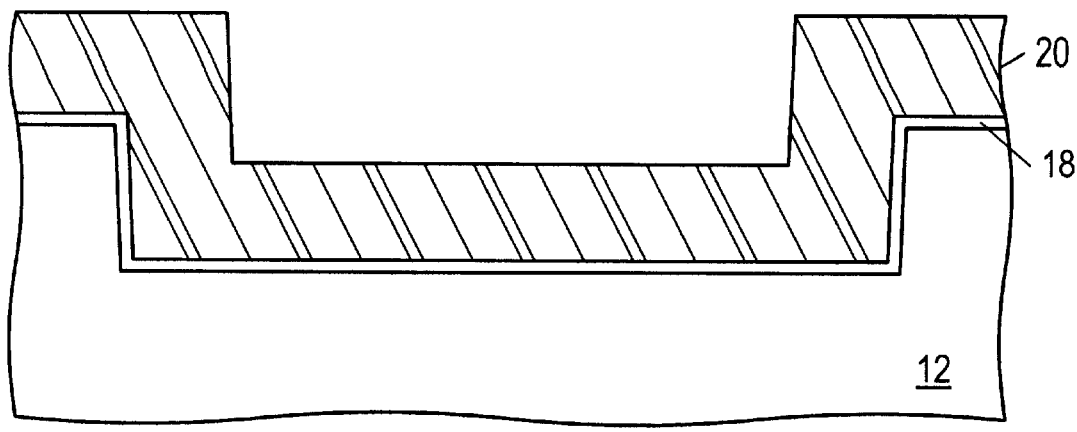
FIG. 4 is a processing step subsequent to that shown in FIG. 3, in which a polysilicon layer has been deposited on the thermal oxide layer.

FIG. 4 shows a processing step subsequent to FIG. 3 in which a polysilicon layer 20 has been deposited on dielectric 18. Formation of polysilicon layer 20 is suitably accomplished by the thermal decomposition of silane ($SiH_4$) in a low pressure chemical vapor deposition chamber maintained at a temperature of approximately 550° to 650° C. In one embodiment of the invention, polysilicon layer 20 is approximately 400 to 2000 angstroms in thickness.

Figure 5:
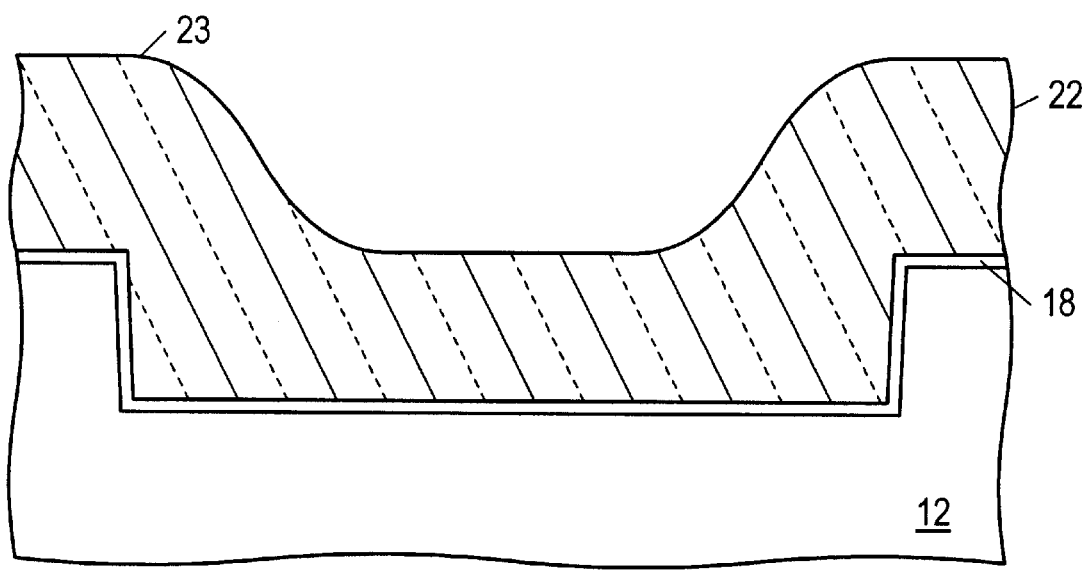
FIG. 5 is a processing step subsequent to that shown in FIG. 4, in which the polysilicon layer has been thermally oxidized.

FIG. 5 shows a processing step subsequent to that shown in FIG. 4, in which polysilicon layer 20 has been thermally oxidized to produce thermal oxide 22. Thermal oxidation of polysilicon layer 20 is suitably performed in a thermal oxidation chamber maintained at approximately 950° C. The ratio of polysilicon consumed during the thermal oxidation to the thermal oxide thickness is approximately the same as the ratio discussed above concerning the thermal oxidation of silicon. Thermal oxide 22 has an upper surface 23 which is substantially conformal with an upper surface of silicon substrate 12. As shown, by performing thermal oxidation after deposition of polysilicon layer 20, the process sequence provides a thermal oxide trench isolation structure while avoiding significant consumption of the active regions 15 and 17. Instead of consuming silicon from substrate 12, the oxidation consumes polysilicon layer 20. Polysilicon 20 therefore serve to direct oxide consumption toward the trench and away from the active regions.

Figure 6:
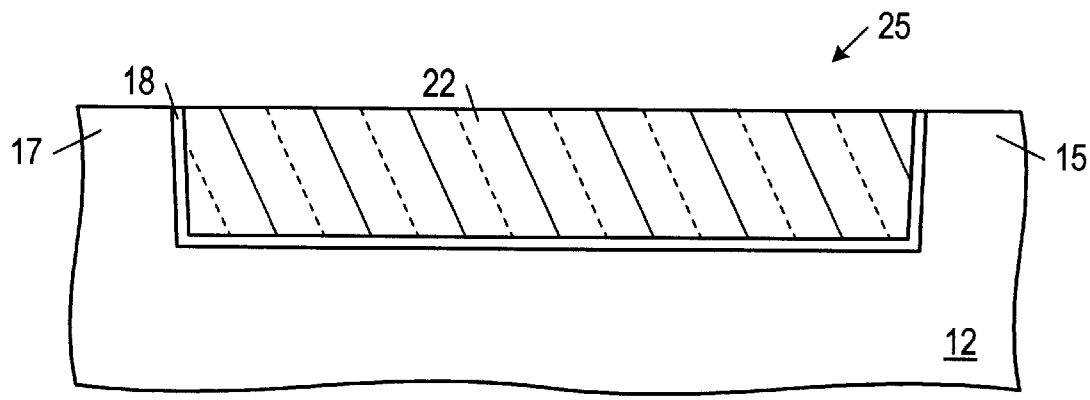
FIG. 6 is a processing step subsequent to that shown in FIG. 5, in which the topography shown in FIG. 5 has been substantially planarized.

FIG. 6 shows an isolation structure 25 resulting from removing upper surface 23 of thermal oxide 22 (shown in FIG. 5). Planarization of the upper surface 23 of thermal oxide 22 is preferably performed with a chemical mechanical polisher. Alternatively, a resist etchback (i.e., sacrificial etchback) can be used in which the ratio of resist etched to $SiO_2$ etched is approximately 1:1. Structure 25 comprises a trench-shaped thermal oxide 22 located between first and second active regions 15 and 17, respectively. The combination of dielectric 18 and trench shaped thermal oxide 22 encroaches upon active areas 15 and 17 by an amount less than or equal to 200 angstroms in a preferred embodiment.

Figure 7:
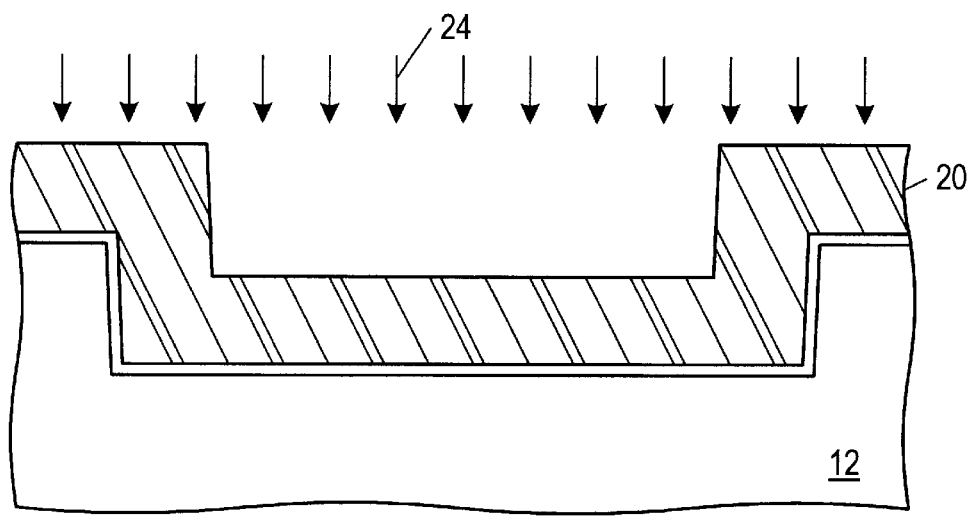
FIG. 7 is a processing step subsequent to that shown in FIG. 4, in which a polysilicon layer is doped with a resistivity decreasing dopant, according to an alternative embodiment.
Figure 8:
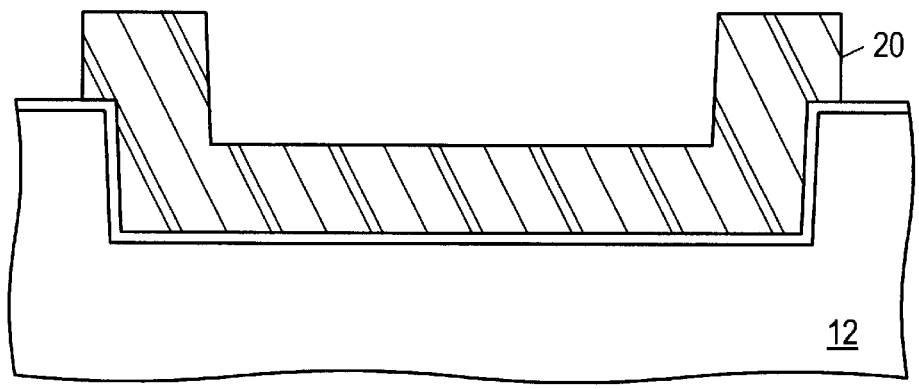
FIG. 8 is a processing step subsequent to that shown in FIG. 7, in which the doped polysilicon layer is patterned and etched.
Figure 9:
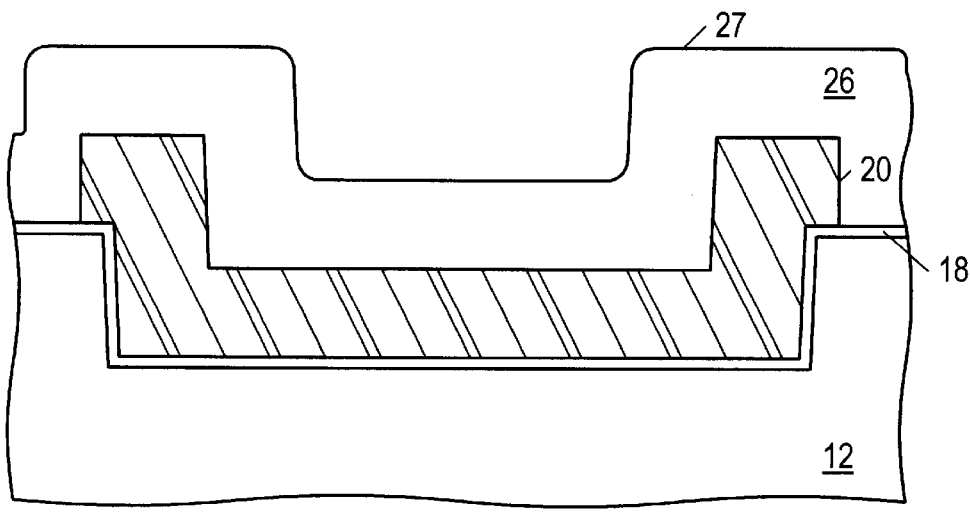
FIG. 9 is a processing step subsequent to that shown in FIG. 8, in which a dielectric layer is formed on the doped polysilicon layer.
Figure 10:
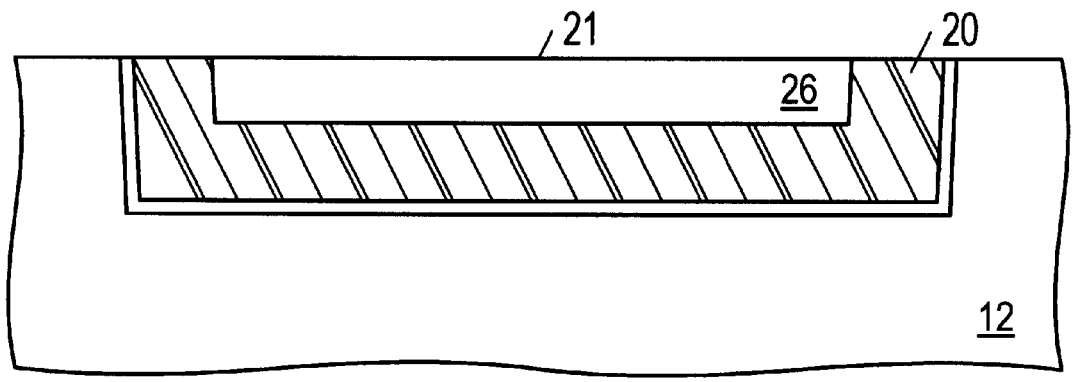
FIG. 10 is a processing step subsequent to that shown in FIG. 9, in which the upper surface is substantially planarized.
Figure 11:
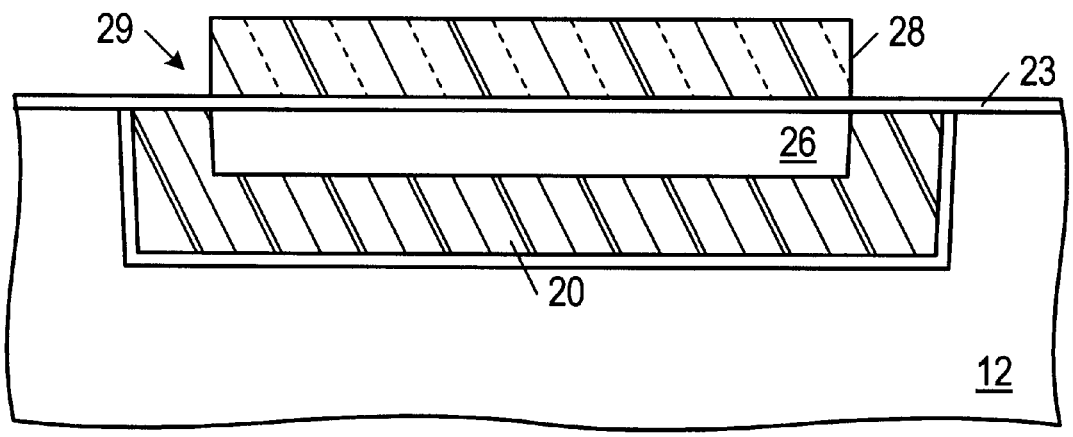
FIG. 11 is a processing step subsequent to that shown in FIG. 10, in which an oxide and a second polysilicon layer are formed on the structure shown in FIG. 10.

FIGS. 7–11 depict a process sequence for an alternative application of a polysilicon layer 20 deposited in a trench which is to serve as a capacitor. FIG. 7 shows the initial stage of a processing sequence dissimilar from the isolation structure formed from FIGS. 5–6. Instead, FIG. 7 shows an alternative capacitor-formed structure subsequent to the processing step of FIG. 4, in which polysilicon layer 20 is doped with dopant 24. Dopant 24 can be introduced into polysilicon layer 20 in situ or post-deposition using an ion implant or a diffusion step. In one embodiment, polysilicon layer 20 is implanted with phosphorus until a sheet resistance of approximately 20–30 $\Omega$/sq. is obtained. FIG. 8 shows a step in which portions of polysilicon layer 20 have been selectively removed through the use of a masking step and an etch step. In FIG. 9, dielectric 26 has been formed upon polysilicon layer 20 and dielectric 18. In one embodiment, dielectric 26 is formed from a TEOS source in a low pressure (i.e., less than approximately 2 torrs) chemical vapor deposition chamber maintained at a temperature of approximately 625° C. FIG. 10 shows a subsequent processing step after a planarization has been performed on the structure shown in FIG. 9. In one embodiment, planarization is accomplished by a chemical mechanical polish performed until an upper surface 21 of substrate 12, dielectric 18, polysilicon layer 20, and dielectric 26 are all substantially coplanar as shown in the drawing. FIG. 11 shows a subsequent processing step in which dielectric 23 and a second polysilicon layer 28 are formed upon surface 21. In one embodiment, dielectric 23 is formed during the gate oxidation step and the second polysilicon layer 28 is formed simultaneous with a laterally displaced gate polysilicon. Like first polysilicon layer 20, second polysilicon layer 28 is deposited in a chemical vapor deposition chamber and is doped either in situ or after deposition with an implant or a post-deposition diffusion step.

Figure 13:
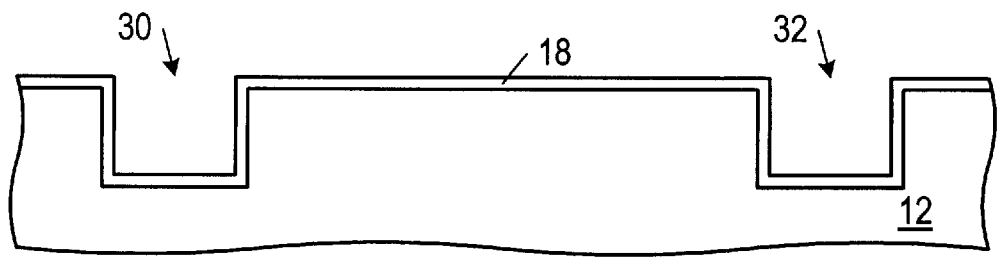
FIG. 13 is a partial cross-sectional view of a semiconductor substrate into which a capacitor trench and an isolation trench have been etched and a thin oxide has been grown.
Figure 14:
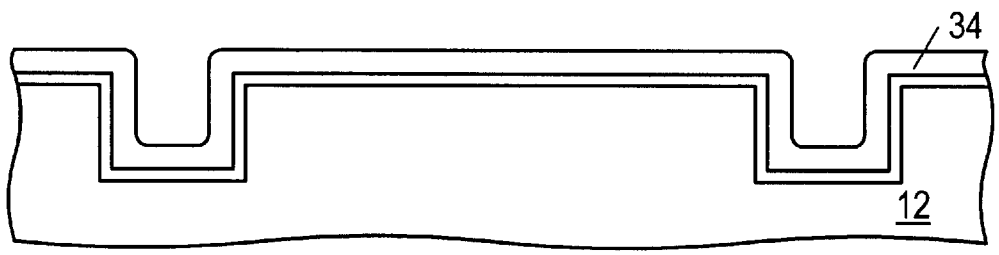
FIG. 14 is a processing step subsequent to that shown in FIG. 13, in which a polysilicon layer has been deposited on the thin oxide.

FIGS. 13–20 show a process sequence in which the trench isolation structure and the trench capacitor structure discussed above are integrated in a single process. In FIG. 13, capacitor trench 30 and isolation trench 32 are etched into silicon substrate 20 and a dielectric layer 18 is formed thereon. A polysilicon layer 34 is then deposited on dielectric 18 as shown in FIG. 14. Dielectric 18 is preferably a thermal oxide 50 to 500 angstroms in thickness while polysilicon layer 34 is preferably 1500 to 3000 angstroms in thickness.

Figure 15:
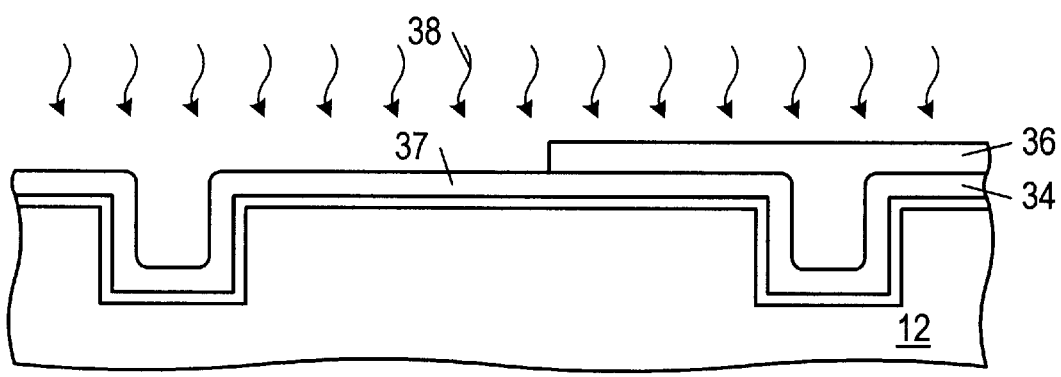
FIG. 15 is a processing step subsequent to that shown in FIG. 14, in which a implant mask has been formed over the isolation trench and a doping step is performed on the exposed polysilicon layer within the capacitor trench.
Figure 16:
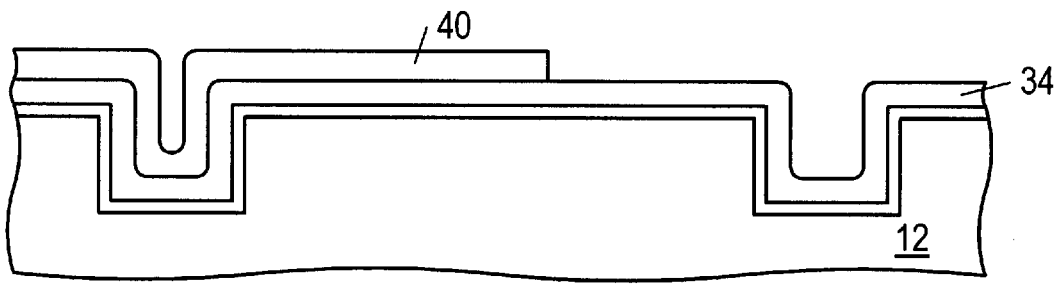
FIG. 16 is a processing step subsequent to that shown in FIG. 15, in which the implant mask has been removed and an oxide barrier layer (e.g., nitride) has been formed over the capacitor trench.
Figure 17:
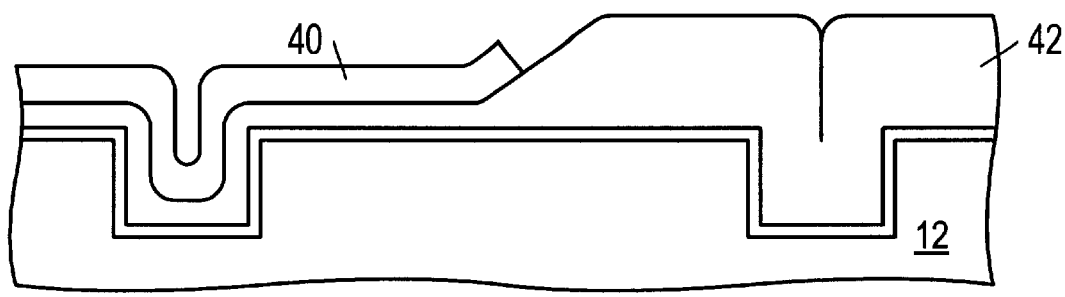
FIG. 17 is a processing step subsequent to that shown in FIG. 16, in which thermal oxidation of the polysilicon within the isolation trench is performed.
Figure 18:
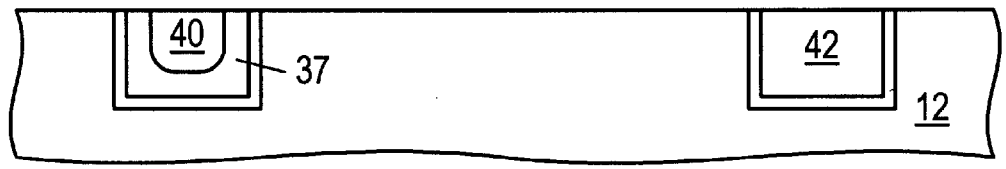
FIG. 18 is a processing step subsequent to that shown in FIG. 17, in which the upper surface has been substantially planarized.

Turning now to FIG. 15, a photoresist layer 36 is patterned over isolation trench 32 and dopant 38 is implanted into the exposed regions 37 of polysilicon layer 34 such that the polysilicon within trench capacitor 30 becomes doped. Photoresist layer 36 is subsequently removed and, as shown in FIG. 16, a layer of silicon nitride 40 is formed and patterned over capacitor trench 30. Silicon nitride deposition is preferably accomplished in a chemical vapor deposition chamber. In one embodiment, silicon nitride layer 40 can be deposited at a temperature of 900° C. while in another embodiment, silicon nitride layer 40 can be deposited in a plasma enhanced CVD reactor at low pressure. Silicon nitride layer 40 provides a mask for a subsequent thermal oxidation. In FIG. 17, polysilicon layer 34 is thermally oxidized. Silicon nitride layer 40 prevents the polysilicon layer within trench capacitor 30 from oxidizing. In FIG. 18, the structure of FIG. 17 has been chemically-mechanically polished back to the upper surface of substrate 12. In one embodiment, silicon nitride layer 40 is left in place prior to the planarization of FIG. 18. In this embodiment, silicon nitride 40 serves as the dielectric for trench capacitor 30. Because the dielectric constant of silicon nitride is approximately twice that of silicon dioxide, the capacitor can be achieved with a substantially smaller cross-sectional area if silicon nitride layer 40 is used as a dielectric. In an embodiment not shown in the drawings, a silicon nitride layer 40 is removed and a conformal dielectric is deposited in capacitor trench 30 prior to the planarization.

Figure 19:
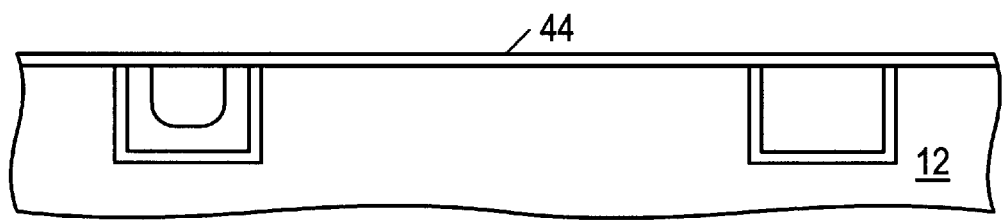
FIG. 19 is a processing step subsequent to that shown in FIG. 18, in which a thermal oxide (e.g., gate oxide) has been formed on the substantially planar upper surface.
Figure 20:
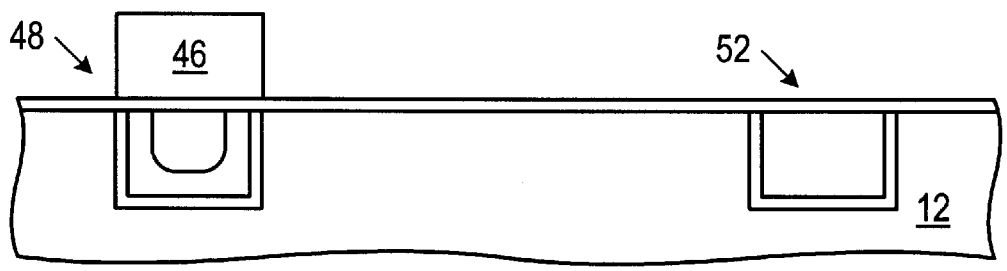
FIG. 20 is a processing step subsequent to that shown in FIG. 19, in which a second polysilicon layer has been formed, patterned and etched over the capacitor trench.

Turning now to FIG. 19, a thermal oxide 44 is formed upon the upper surface of substrate 12. In one embodiment, thermal oxide 44 is comprised of the process gate oxide. In FIG. 20, a second polysilicon layer 46 has been deposited on oxide layer 44 and subsequently patterned and etched. Second polysilicon layer 46 is preferably doped using the same procedure used to dope first polysilicon layer 34. FIG. 20 shows capacitor 48 and isolation trench 50 formed from a single process.

The processing steps described above are illustrative of an exemplary isolation structure 25 and a capacitor structure 29 shown in FIG. 6 and FIG. 11, respectively. However, it is understood that the formation of each layer shown can take on a numerous forms. The exemplary embodiment shown are therefore merely exemplary of a single form of numerous forms. All of this would be obvious to a person skilled in the art having the benefit of this disclosure. Various modifications and changes may be made to each and every processing step as would be obvious to a person skilled in the art having the benefit of this disclosure. It is intended the following claims be interpreted to embrace all such modifications and changes and, accordingly, the specification and drawings are to be regarded in an illustrative rather than a restrictive sense.

What is claimed is:

1. A method of fabricating a capacitor in a substrate of a semiconductor wafer, comprising:
    removing the substrate to a depth within a region of said semiconductor wafer to form a trench;
    forming a first dielectric layer upon said trench;
    depositing a first polysilicon layer on said first dielectric layer;
    doping said first polysilicon layer;
    forming a second dielectric on said first polysilicon layer;
    substantially planarizing an upper surface of said second dielectric; and
    depositing a second polysilicon layer over said second dielectric to form a capacitor having said second dielectric interposed between said first and second polysilicon layers, wherein said first and second polysilicon layers form first and second plates respectively of said capacitor.

2. The method of claim 1 wherein, said forming a first dielectric layer comprises thermally oxidizing said semiconductor wafer.

3. The method of claim 1, wherein said first dielectric layer is 40 to 500 angstroms in thickness.

4. The method of claim 1, further comprising:
    forming a third dielectric layer on said upper surface of said second dielectric.

5. A semiconductor fabrication method, comprising:
    etching a first trench having sidewalls and a floor into a semiconductor substrate;
    forming a first dielectric layer upon said first trench sidewalls and floor;
    depositing a first polysilicon layer upon said first dielectric layer within said first trench;
    doping said first polysilicon layer within said first trench;
    forming a second dielectric upon said first polysilicon layer within said first trench;
    planarizing upper surfaces of said first polysilicon layer within said trench and said second dielectric substantially to an upper surface of said substrate;
    depositing a second polysilicon layer over said second dielectric; and
    doping said second polysilicon layer over said second dielectric.

6. The method as recited in claim 5, wherein said forming a first dielectric layer comprises thermally oxidizing said first trench sidewalls and floor.

7. The method as recited in claim 5, wherein said first dielectric layer is 50 to 500 angstroms thick.

8. The method as recited in claim 5, wherein said first polysilicon layer is 1500 to 3000 angstroms thick.

9. The method as recited in claim 5, further comprising:
    etching a second trench having sidewalls and a floor into said semiconductor substrate;
    forming said first dielectric layer upon said second trench sidewalls and floor;
    depositing said first polysilicon layer upon said first dielectric layer within said second trench; and
    thermally oxidizing said first polysilicon layer within said second trench.

10. The method as recited in claim 9, further comprising, subsequent to said forming said first dielectric layer within said second trench and prior to said doping said first polysilicon layer within said first trench, patterning a photoresist layer over said second trench.

11. The method as recited in claim 10, further comprising removing said photoresist layer prior to said thermally oxidizing said first polysilicon layer within said second trench.

12. The method as recited in claim 9, wherein said second dielectric comprises silicon nitride patterned over said first trench, wherein said silicon nitride prevents said first polysilicon layer within said first trench from oxidizing during said thermally oxidizing said first polysilicon layer within said second trench.

13. The method as recited in claim 12, wherein said silicon nitride is deposited at temperature of 900° C.

14. The method as recited in claim 12, wherein said silicon nitride is deposited in a low pressure plasma enhanced chemical vapor deposition reactor.

15. The method as recited in claim 9, further comprising patterning silicon nitride over said first trench, wherein said silicon nitride prevents said first polysilicon layer within said first trench from oxidizing during said thermally oxidizing said first polysilicon layer within said second trench.

16. The method as recited in claim 15, further comprising:
    removing said silicon nitride; and
    wherein said forming a second dielectric upon said first polysilicon layer within said first trench comprises depositing a conformal dielectric in said first trench.

17. The method as recited in claim 9, wherein said thermally oxidizing said first polysilicon layer within said second trench substantially fills said second trench with oxidized polysilicon, the method further comprising planarizing said oxidized polysilicon within said second trench to an upper surface of said substrate.

18. The method as recited in claim 17, wherein said planarizing comprises chemically-mechanically polishing said first polysilicon layer within said first trench, said oxidized polysilicon within said second trench, and said second dielectric.

19. The method as recited in claim 5, further comprising forming a thermal oxide layer over said first trench, wherein said second polysilicon layer is deposited upon said thermal oxide layer.

20. The method as recited in claim 19, wherein said forming a thermal oxide layer comprises forming a gate oxide.

21. The method as recited in claim 5, wherein said doping said first and second polysilicon layers is performed in situ with said depositing said first and second polysilicon layers respectively.

22. The method as recited in claim 5, wherein said doping said first and second polysilicon layers comprises implanting or diffusing a dopant into said first and second polysilicon layers after their respective said depositing.

23. The method as recited in claim 5, wherein said doping said first polysilicon layer within said first trench comprises implanting with phosphorous until a sheet resistance of approximately 20–30 Ω/sq. is obtained.

24. A semiconductor fabrication process, comprising:

etching a first trench portion and a second trench portion into a semiconductor substrate;

lining said first and second trench portions with a first dielectric layer;

depositing a first polysilicon layer upon said first dielectric layer within said first and second trench portions;

doping said first polysilicon layer within said first trench portion, wherein said first polysilicon layer within said second trench portion is masked from said doping;

forming a second dielectric layer upon said first polysilicon layer within said first trench portion;

oxidizing said first polysilicon layer within said second trench portion, wherein said first polysilicon layer within said first trench portion is masked from said oxidizing;

depositing a second polysilicon layer over said second dielectric layer; and doping said second polysilicon layer over said second dielectric layer.

25. A semiconductor fabrication process, comprising:

etching a first trench portion and a second trench portion into a semiconductor substrate;

lining said first and second trench portions with a first dielectric layer;

depositing a first polysilicon layer upon said first dielectric layer within said first and second trench portions;

doping said first polysilicon layer within said first trench portion, wherein said first polysilicon layer within said second trench portion is masked from said doping;

forming a second dielectric layer upon said first polysilicon layer within said first trench portion;

oxidizing said first polysilicon layer within said second trench portion, wherein said oxidizing said first polysilicon layer within said second trench portion substantially fills said second trench portion with oxidized polysilicon;

depositing a second polysilicon layer over said second dielectric layer; and doping said second polysilicon layer over said second dielectric layer.

* * * * *